(12) United States Patent
Lin et al.

(10) Patent No.: US 11,776,897 B2
(45) Date of Patent: Oct. 3, 2023

(54) ELECTRONIC MODULE, MANUFACTURING METHOD THEREOF AND ELECTRONIC PACKAGE HAVING THE SAME

(71) Applicant: SILICONWARE PRECISION INDUSTRIES CO., LTD., Taichung (TW)

(72) Inventors: Ho-Chuan Lin, Taichung (TW); Chia-Chu Lai, Taichung (TW); Min-Han Chuang, Taichung (TW)

(73) Assignee: SILICONWARE PRECISION INDUSTRIES CO., LTD.

( * ) Notice: Subject to any disclaimer, the term of this patent is extended or adjusted under 35 U.S.C. 154(b) by 29 days.

(21) Appl. No.: 17/465,137

(22) Filed: Sep. 2, 2021

(65) Prior Publication Data
US 2022/0359374 A1 Nov. 10, 2022

(30) Foreign Application Priority Data
May 4, 2021 (TW) .................................. 110116025

(51) Int. Cl.
*H01L 23/31* (2006.01)
*H01L 23/522* (2006.01)
*H01L 49/02* (2006.01)

(52) U.S. Cl.
CPC .......... *H01L 23/5223* (2013.01); *H01L 23/31* (2013.01); *H01L 23/5226* (2013.01); *H01L 28/40* (2013.01)

(58) Field of Classification Search
CPC ........................... H01L 23/5223; H01L 23/31
See application file for complete search history.

(56) References Cited

U.S. PATENT DOCUMENTS

| 9,704,836 B2 * | 7/2017 | Lin | H01L 24/14 |
| 2005/0212134 A1 * | 9/2005 | Pu | H01L 24/81 |
| | | | 257/E21.511 |
| 2011/0186978 A1 * | 8/2011 | Kim | H01L 24/06 |
| | | | 257/777 |
| 2012/0175779 A1 * | 7/2012 | Lin | H01L 23/3128 |
| | | | 257/773 |
| 2014/0175605 A1 * | 6/2014 | Kim | H01L 23/642 |
| | | | 257/532 |
| 2017/0103946 A1 * | 4/2017 | Chang | H01L 23/5223 |
| 2017/0103969 A1 * | 4/2017 | Krause | H01L 23/481 |
| 2019/0057949 A1 * | 2/2019 | Hwang | H01L 21/6835 |
| 2019/0393297 A1 * | 12/2019 | Kung | H05K 1/162 |
| 2022/0384332 A1 * | 12/2022 | Chen | H01L 25/162 |

* cited by examiner

*Primary Examiner* — Eugene Lee
(74) *Attorney, Agent, or Firm* — KELLY & KELLEY, LLP

(57) ABSTRACT

An electronic module is provided, in which a first metal layer, an insulating layer and a second metal layer are sequentially formed on side faces and a non-active face of an electronic component to serve as a capacitor structure, where the capacitor structure is exposed from an active face of the electronic component so that by directly forming the capacitor structure on the electronic component, a distance between the capacitor structure and the electronic component is minimized, such that the effect of suppressing impedance can be optimized.

16 Claims, 7 Drawing Sheets

ELECTRONIC MODULE, MANUFACTURING METHOD THEREOF AND ELECTRONIC PACKAGE HAVING THE SAME

BACKGROUND

1. Technical Field

The present disclosure relates to a semiconductor chip, and more particularly, to an electronic module having a capacitor structure, a manufacturing method thereof, and an electronic package having the same.

2. Description of Related Art

With the rapid development in end products that employ high speed computations, for example, products like autonomous vehicles, super computers or mobile devices, electronic components inside these products have also faced with technological bottlenecks and challenges. For example, in the case of a semiconductor chip disposed on a substrate, when the loop current of a metal trace of the substrate is connected to the semiconductor chip, high-frequency power supply impedance that generates noise is created. This tends to lead to the semiconductor chip generating inaccurate signals due to interference at critical positions and, in turn, resulting in inaccurate actions.

Therefore, decoupling capacitors (or simply decap) have been provided at various locations around the substrate to suppress the creation of high-frequency power supply impedance.

FIG. 1A is a cross-sectional schematic view of a conventional electronic device 1. As shown in FIG. 1A, the electronic device 1 includes a semiconductor package 1a, in which a through-silicon interposer (TSI) 13 is disposed between a package substrate 11 and a semiconductor chip 10. The TSI 13 includes through-silicon vias (TSVs) 130 and redistribution layers (RDLs) 131 formed on the TSVs 130, such that the TSVs 130 at an interposed side 13b are electrically coupled to solder pads 110 of the package substrate 11 with larger spacing via a plurality of conductive components 16. The conductive components 16 are covered by an underfill 15. Further, electrode pads 100 of the semiconductor chip 10 with smaller spacing are electrically coupled to the RDLs 131 at a chip-placement side 13a of the TSI 13 via a plurality of solder bumps 101. The solder bumps 101 are covered by an underfill 14. Finally, an encapsulant 12 is formed on the package substrate 11 for encapsulating the semiconductor chip 10 and the TSI 13.

The electronic device 1 further includes a circuit board 1b. A plurality of solder balls 17 are formed on the underside of the package substrate 11 of the semiconductor package 1a for connecting with the circuit board 1b.

In the conventional electronic device 1, defining an impedance generated when no decap is provided as 1x, when at least one decap 18a is disposed at various positions in the electronic device 1, the closer at least one decap 18a is to the semiconductor chip 10, the better the effect of impedance suppression. This is shown in Table 1 below:

TABLE 1

| Position of Decap | On circuit board (shown in FIG. 1A) | On interposed side of TSI | Around semiconductor chip on RDL | Inside TSI |
|---|---|---|---|---|
| Impedance | 0.999x | 0.348x | 0.151x | 0.058x |

Therefore, based on the principle above, a decap structure has been integrated into the TSI 13. As shown in FIG. 1B, when manufacturing the TSVs 130 of the TSI 13, a plurality of conductive openings 132 arranged at intervals and not penetrating through the TSI 13 are manufactured at the same time to be used as a decap 18b. The decap 18b is electrically conducted with the semiconductor chip 10 via the RDLs 131, so the decap 18b can be very closed to the semiconductor chip 10 to achieve the effect of impedance suppression (such as an impedance value of 0.058x shown in Table 1).

However, in the TSI 13, the conductive openings 132 have to be manufactured in accordance with the TSVs 130. Therefore, manufacturing processes such as filling of a dielectric material, electroplating of a metal, etc., have to be performed in the openings, which results in issues, such as long processing time, higher manufacturing cost, increased production difficulty, poorer production yield, and the like. This contradicts with the demand for lowering the cost of the electronic device 1.

Therefore, there is a need for a solution that addresses the aforementioned issues of the prior art.

SUMMARY

In view of the aforementioned shortcomings of the prior art, the present disclosure provides an electronic module, which comprises: an electronic component having an active face and a non-active face opposite to the active face and side faces adjacent to the active face and the non-active face, and the active face including a plurality of electrode pads; and a capacitor structure formed on the electronic component and exposed from the active face, wherein the capacitor structure includes a first metal layer disposed on the electronic component and electrically connected with the plurality of electrode pads, an insulating layer disposed on the first metal layer, and a second metal layer disposed on the insulating layer and electrically coupled with the first metal layer, and wherein the first metal layer is free from being in contact with the second metal layer.

The present disclosure further provides a method of manufacturing an electronic module, which comprises: disposing an electronic component on a carrier, wherein the electronic component includes an active face and a non-active face opposite to the active face and side faces adjacent to the active face and the non-active face, and the active face includes a plurality of electrode pads, such that the electronic component is attached onto the carrier via the active face; sequentially forming a first metal layer, an insulating layer, and a second metal layer on the electronic component, wherein the first metal layer is free from being in contact with the second metal layer, such that the first metal layer, the insulating layer and the second metal layer act as a capacitor structure; and removing the carrier.

In the aforementioned electronic module and method, the capacitor structure is formed on the active face and/or the side faces of the electronic component.

In the aforementioned electronic module and method, the capacitor structure is of a decoupling capacitor type.

In the aforementioned electronic module and method, the present application further comprises at least one wire disposed inside the electronic component and electrically connected with the electrode pads, wherein the first metal layer is electrically connected with the wire, and wherein the wire is exposed from the side faces and/or the non-active face of the electronic component.

In the aforementioned electronic module and method, the electronic component includes a single set of power supply transmission structure, and the capacitor structure is electrically connected with the power supply transmission structure.

In the aforementioned electronic module and method, the electronic component includes multiple sets of power supply transmission structures, and the capacitor structure is electrically connected with the multiple sets of power supply transmission structures. For example, the first metal layer includes a plurality of separate electrical connectors that are electrically connected to different sets of the power supply transmission structures, respectively. Furthermore, in the aforementioned electronic module and method, the present application further comprises a partitioning region formed between the electrical connectors on the non-active face, wherein the partitioning region is free from being covered by the first metal layer, and the insulating layer is formed on the partitioning region and in contact with the non-active face.

The present disclosure further provides an electronic package, which comprises: a carrier structure including a circuit layer; and the aforementioned electronic module disposed on the carrier structure, and the capacitor structure being electrically connected with the circuit layer.

The aforementioned electronic package further includes a routing structure electrically connected with the electronic component, wherein the routing structure includes a first surface and a second surface opposite to the first surface, such that the electronic module is disposed on the first surface, and at least one second electronic component is disposed on the second surface. Alternatively, the circuit layer of the carrier structure and the routing structure are electrically connected with each other via a plurality of conductive posts.

The aforementioned electronic package further comprises a plurality of conductive posts formed on the carrier structure and electrically connected with the circuit layer. For example, the electronic package further includes an encapsulant covering the plurality of conductive posts, the electronic component and the capacitor structure.

In the aforementioned electronic package, the electronic package further includes an encapsulant covering the electronic component and the capacitor structure.

As can be understood from the above, the electronic module, the manufacturing method thereof, and the electronic package having the same of the present disclosure allow the capacitor structure to be located adjacent to the electronic component by directly forming the capacitor structure on the electronic component. Thus, compared to the prior art, the electronic module of the present disclosure not only minimizes the distance between the decoupling capacitor (i.e., the capacitor structure) and the semiconductor chip (i.e., the electronic component) to optimize the effect of impedance suppression, but at the same time, meets the demand for lower manufacturing cost.

BRIEF DESCRIPTION OF THE DRAWINGS

FIG. 3E-2 and FIG. 3F-2 are cross-sectional schematic views depicting an alternative of FIGS. 3E-1 and 3F-1.

FIG. 3E-3 is a partial top schematic view of FIG. 3E-2.

DETAILED DESCRIPTION OF THE EMBODIMENTS

Figure 1A:
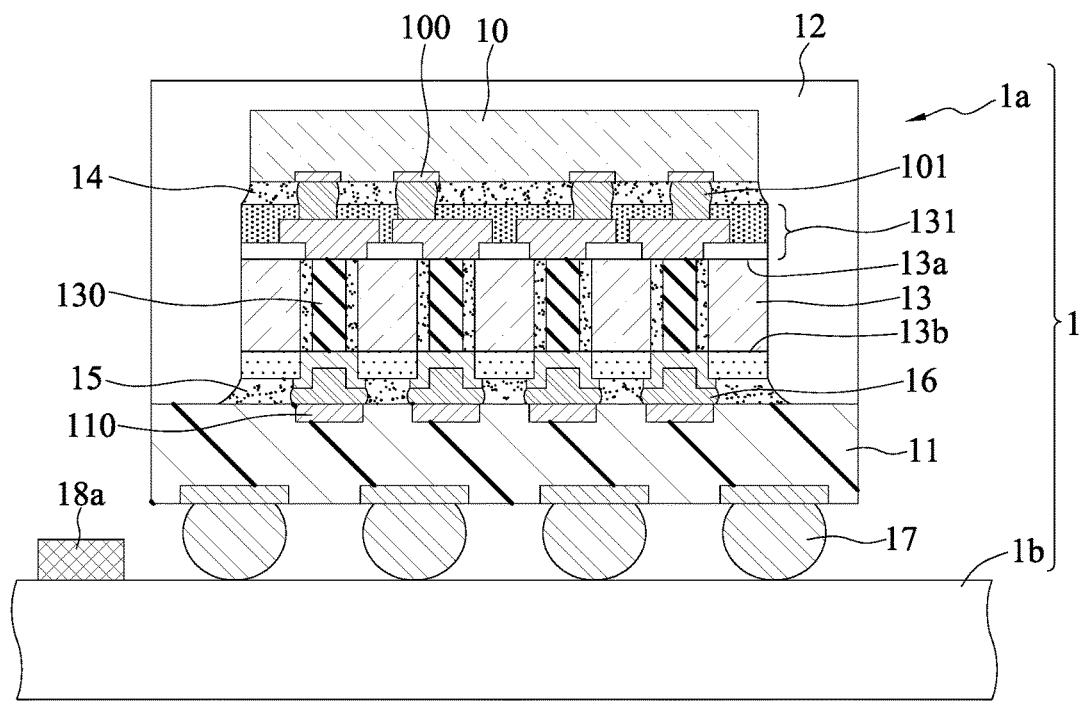
FIG. 1A is a cross-sectional schematic view of a conventional electronic device.
Figure 1B:
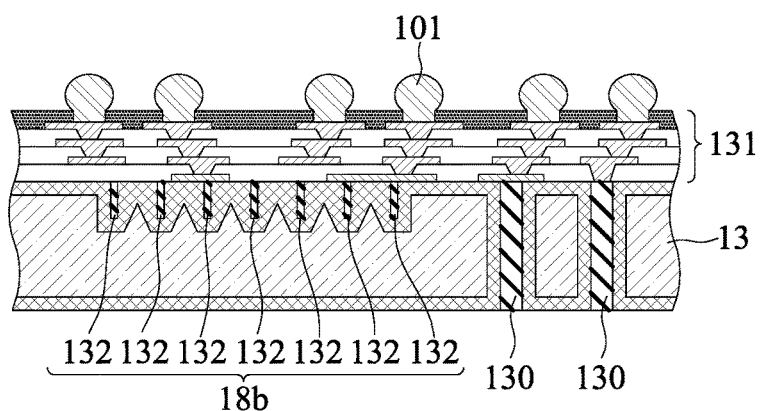
FIG. 1B is a cross-sectional schematic view of another aspect of a through silicon interposer in FIG. 1A.

The implementations of present disclosure are illustrated using the following specific embodiments. One of ordinary skill in the art can readily understand other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIGS. 2A to 2E are cross-sectional schematic views illustrating a method of manufacturing an electronic package 2 having a capacitor structure 22 in accordance with the present disclosure.

Figure 2A:
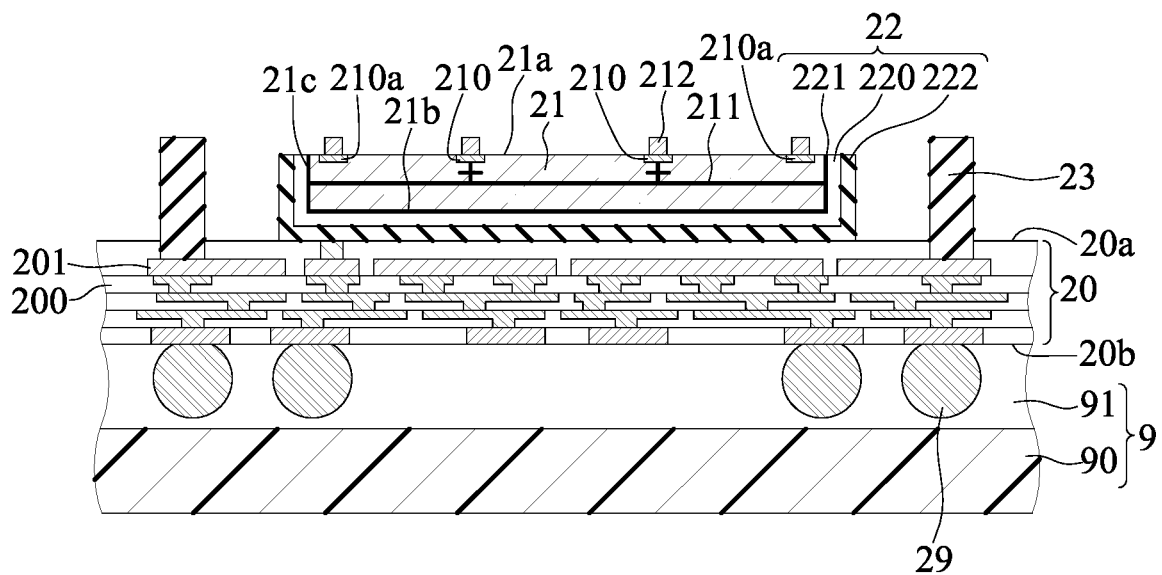
FIGS. 2A to 2E are cross-sectional schematic views illustrating a method of manufacturing an electronic package in accordance with the present disclosure.

As shown in FIG. 2A, a carrier structure 20 is provided on a carrier 9. The carrier structure 20 includes a first side 20a and a second side 20b opposite to each other. At least one first electronic component 21 and a plurality of conductive posts 23 (for example, made of a metallic material such as copper or a soldering material) are provided on the first side 20a of the carrier structure 20.

In an embodiment, the carrier structure 20 is, for example, a package substrate with a core layer and circuit structures, a coreless package substrate with circuit structures, a through-silicon interposer (TSI) with through-silicon vias (TSVs) or other type of substrates. The carrier structure 20 includes at least one first dielectric layer 200 and at least one first circuit layer 201 connected with the first dielectric layer 200. The first circuit layer 201 is, for example, a fan-out redistribution layer (RDL). In one example, the material forming the first circuit layer 201 is copper, and the material forming the first dielectric layer 200 is a dielectric material, such as polybenzoxazole (PBO), polyimide (PI), or a prepreg (PP). It can be understood that the carrier structure 20 can also be other types of substrate for carrying a chip, such as a lead frame, a wafer, other types of boards with metal routings, or the like, and the present disclosure is not limited to the above.

Furthermore, the second side 20b of the carrier structure 20 is disposed on the carrier 9 via a plurality of conductive components 29. In an example, the carrier 9 includes a board 90 made of a semiconductor, a dielectric material, a ceramic material, a glass material or a metallic material, but the present disclosure is not limited thereto. The size of the carrier 9 can be chosen as a wafer form substrate or a panel form substrate depending on the needs. A bonding layer 91, such as a release film or an adhesive, can be formed on the board 90 by coating or bonding. The carrier structure 20 can be pressure bonded onto the bonding layer 91, such that the conductive components 29 are embedded into the bonding layer 91.

Moreover, the first electronic component 21 is an active component, a passive component or a combination thereof, wherein the active component can be, for example, a semiconductor chip, and a passive component can be, for example, a resistor, a capacitor or an inductor. In an embodiment, the first electronic component 21 is a semiconductor chip having an active face 21a, a non-active face 21b opposite to the active face 21a, and side faces 21c adjacent to the active face 21a and the non-active face 21b. The first electronic component 21 is disposed on the first side 20a of the carrier structure 20 via the non-active face 21b of the first electronic component 21, and there are a plurality of electrode pads 210 (which can be located in the middle of the active face 21a shown in FIG. 2A) and a plurality of contacts 210a (which can be located on the periphery of the active face 21a shown in FIG. 2A) on the active face 21a. At least one wire 211 electrically connected to the electrode pads 210 and a plurality of integrated circuits (not shown) electrically connected to the contacts 210a are provided inside the first electronic component 21. The wire 211 is exposed from the side faces 21c of the first electronic component 21. In an example, conductors 212 (in the shapes of pillars, pins or other types of bumps) can be formed on the electrode pads 210 and the contacts 210a as needed. An insulating protective film (not shown) is formed on the active face 21a in such a way that the conductors 212 are exposed from the insulating protective film.

In addition, a capacitor structure 22, such as a decoupling capacitor (decap), that is electrically connected with the first electronic component 21 is formed on the non-active face 21b and the side faces 21c of the first electronic component 21. The capacitor structure 22 includes a first metal layer 221 provided on the first electronic component 21 (the non-active face and the side faces) and electrically connected with the wire 211, an insulating layer 220 provided on the first metal layer 221, and a second metal layer 222 provided on the insulating layer 220 and electrically coupled with the first metal layer 221. The first electronic component 21 is provided on the first side 20a of the carrier structure 20 through the capacitor structure 22. The second metal layer 222 is electrically connected to the first circuit layer 201 and used as a ground port of the capacitor structure 22. In an example, the materials forming the first metal layer 221 and the second metal layer 222 are copper, and the material forming the insulating layer 220 is a dielectric material, such as PBO, PI, PP, etc.

Figure 2B:
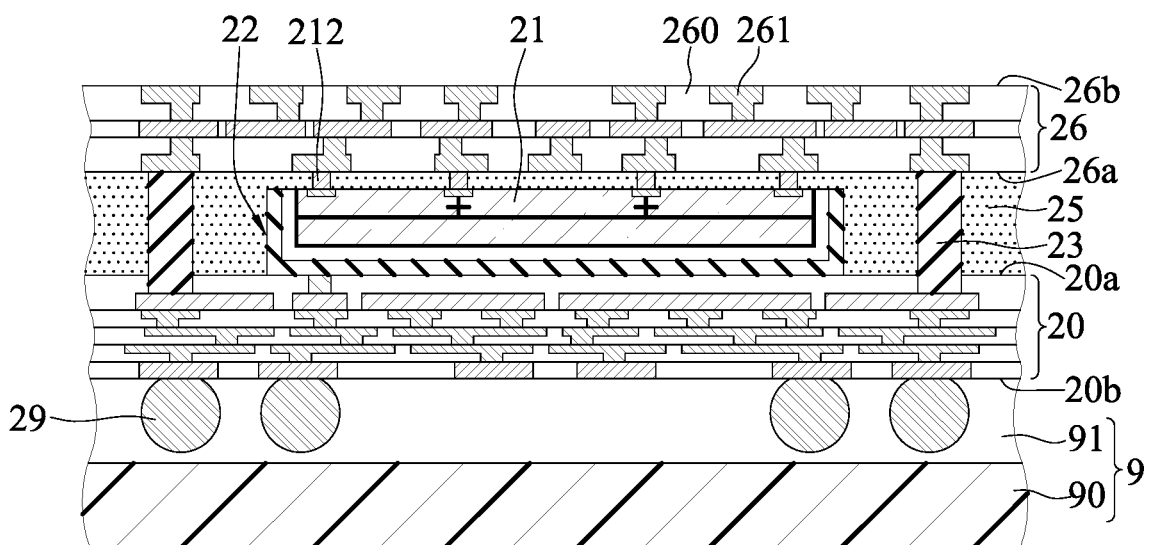

As shown in FIG. 2B, an encapsulant 25 is formed on the first side 20a of the carrier structure 20, such that the encapsulant 25 covers the first electronic component 21, the capacitor structure 22 and the conductive posts 23. Next, a routing structure 26 is formed on the encapsulant 25, such that the routing structure 26 is electrically connected with the conductive posts 23 and the first electronic component 21.

In an embodiment, the material forming the encapsulant 25 is an insulating material, such as PI, a dry film, epoxy resin, or a molding compound, but the present disclosure is not limited as such. In an example, the encapsulant 25 can be laminated or molded on the first side 20a of the carrier structure 20.

Furthermore, a planarization process can be performed as needed to allow the upper surface of the encapsulant 25 to be flush with the end faces of the conductive posts 23 and the top faces of the conductors 212, and the end faces of the conductive posts 23 and the top faces of the conductors 212 to be exposed from the encapsulant 25. For example, the planarization process can be carried out by polishing to remove part of the conductive posts 23, part of the conductors 212 and part of the encapsulant 25.

Moreover, the routing structure 26 includes a first surface 26a and a second surface 26b opposite to each other. The routing structure 26 is bonded to the encapsulant 25 via the first surface 26a of the routing structure 26, such that the first electronic component 21 and the conductive posts 23 are disposed on the first surface 26a.

In addition, the routing structure 26 includes at least one second dielectric layer 260 and a second circuit layer 261 (e.g., RDL) disposed on the second dielectric layer 260. The second circuit layer 261 of the routing structure 26 is electrically connected with the conductive posts 23 and the conductors 212 on the first electronic component 21. In an example, the material forming the second circuit layer 261 is copper, and the material forming the second dielectric layer 260 is a dielectric material, such as PBO, PI, or a PP.

Figure 2C:
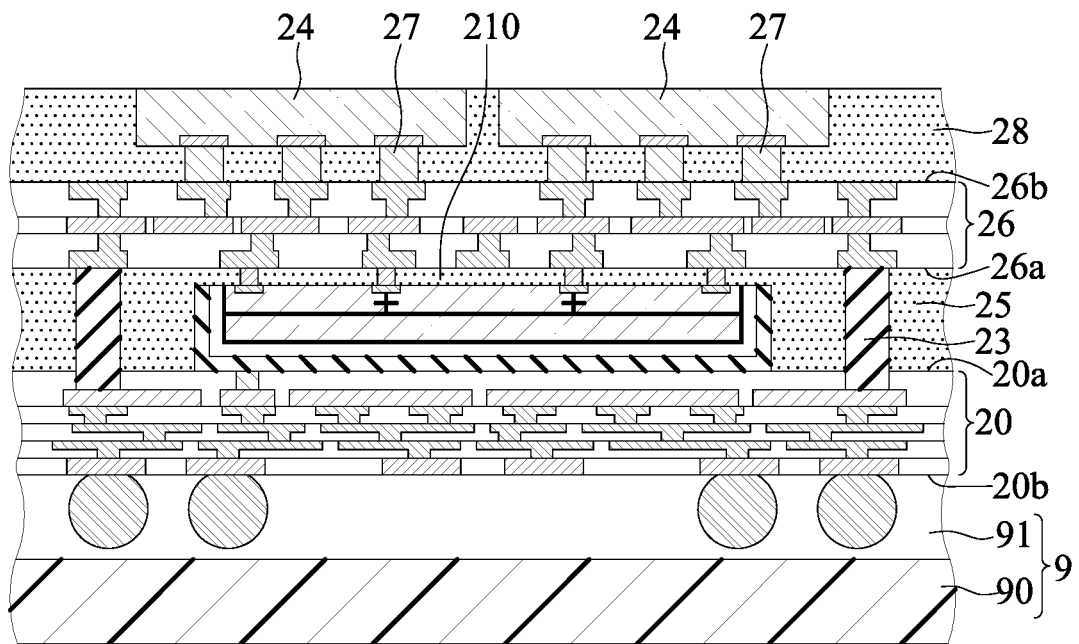

As shown in FIG. 2C, at least one second electronic component 24 is disposed on the second surface 26b of the routing structure 26, and an encapsulation layer 28 is formed to encapsulate the second electronic component 24.

In an embodiment, the second electronic component 24 is an active component, a passive component or a combination thereof, and the active component can be, for example, a semiconductor chip, and a passive component can be, for example, a resistor, a capacitor or an inductor. In an example, the second electronic component 24 is electrically connected to the second circuit layer 261 of the routing structure 26 in a flip-chip manner via a plurality of conductive bumps 27 (e.g., solder bumps, copper bumps, or other types of bumps). However, there are numerous ways in which the second electronic component 24 can be connected with the routing structure 26, such as wire bonding, and the present disclosure is not limited to the above.

Furthermore, the encapsulation layer 28 can encapsulate the second electronic component 24 and the conductive bumps 27 at the same time. Alternatively, an underfill (not shown) can first be formed between the second electronic component 24 and the second surface 26b of the routing structure 26 to cover the conductive bumps 27, and then the encapsulation layer 28 is formed to cover the underfill and the second electronic component 24.

Moreover, the encapsulation layer 28 is an insulating material, such as PI, a dry film, or an encapsulant or molding compound such as epoxy resin. The encapsulation layer 28 can be laminated or molded on the routing structure 26. It can be understood that the material forming the encapsulation layer 28 can be the same as or different from that forming the encapsulant 25.

In addition, the encapsulation layer 28 can cover the back (not shown) of the second electronic component 24 or expose the back of the second electronic component 24 (as shown in FIG. 2C).

Figure 2D:
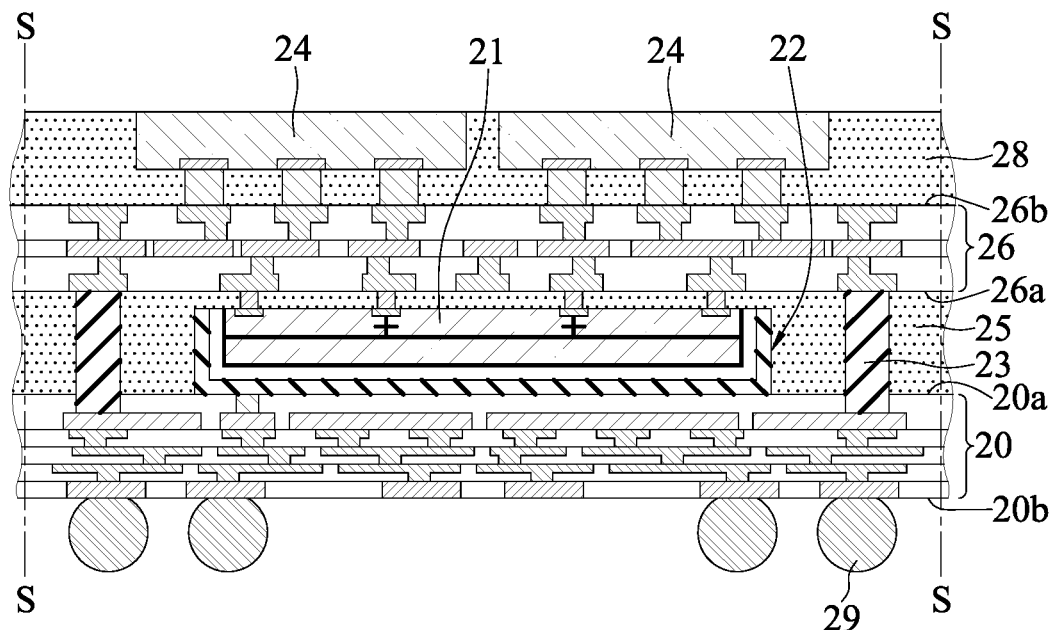

As shown in FIG. 2D, the carrier 9 and the bonding layer 91 thereon are removed to expose the plurality of conductive components 29.

Figure 2E:
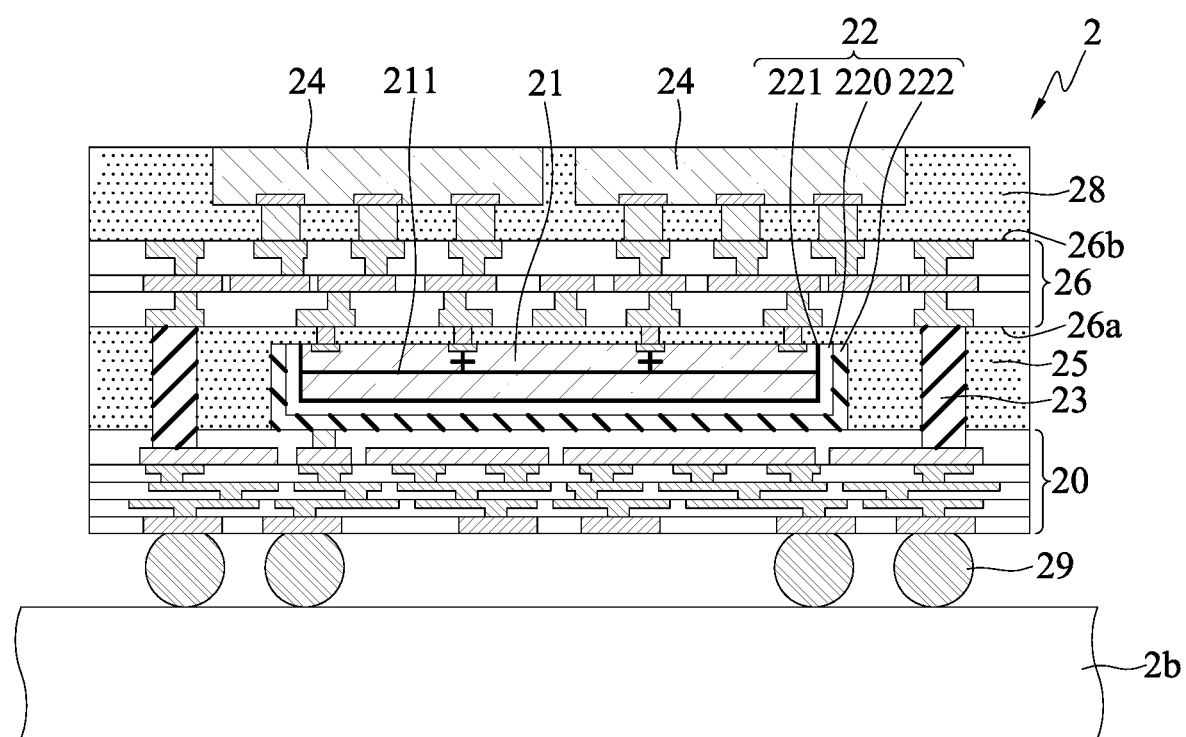

As shown in FIG. 2E, a singulation process is performed along cutting paths S shown in FIG. 2D to obtain a plurality of electronic packages 2, each of the electronic packages 2 can be disposed onto a circuit board 2b via the respective conductive components 29.

As such, the electronic package 2 of the present disclosure uses a metal-insulator-metal diode (MIM diode) technique, in which the capacitor structure 22 is formed on the first electronic component 21, so that the capacitor structure 22 is adjacent to the first electronic component 21, allowing the decap to be closest to the semiconductor chip. Thus, compared to the prior art, based on the principle described in relation to Table 1, the electronic package 2 of the present disclosure allows the capacitor structure 22 and the first electronic component 21 to be embedded in the same place in the encapsulant 25, minimizing the distance between the two, thereby optimizing the effect of impedance suppression (impedance value less than 0.058x, about 0.01x-0.04x) and in turn, eliminating noise created by the impedance.

FIGS. 3A to 3F-1 are cross-sectional schematic views illustrating a method of manufacturing an electronic module 3 associated with the first electronic component 21 having the capacitor structure 22 in accordance with the present disclosure.

Figure 3A:
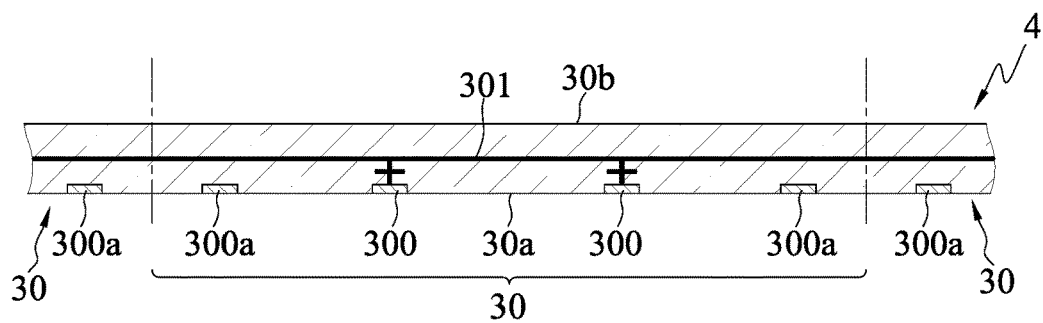
FIGS. 3A to 3D, 3E1 and 3F-1 are cross-sectional schematic views illustrating a method of manufacturing an electronic module in accordance with the present disclosure.
Figure 3B:
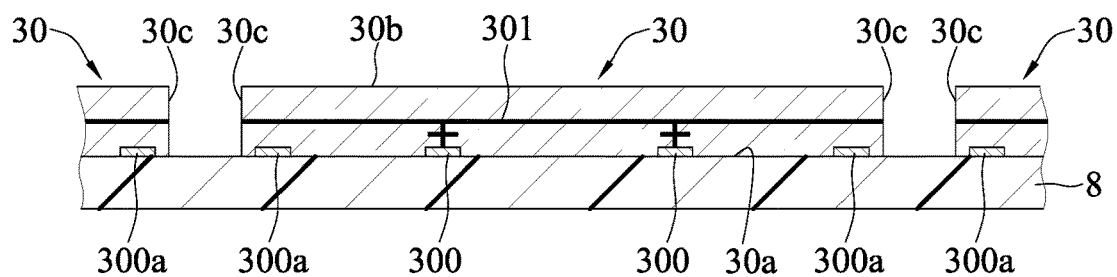
Figure 3C:
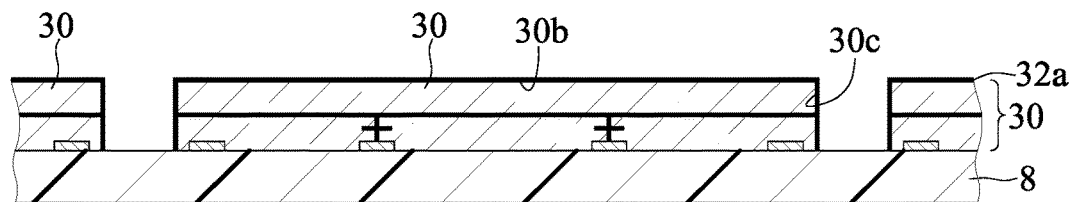
Figure 3D:
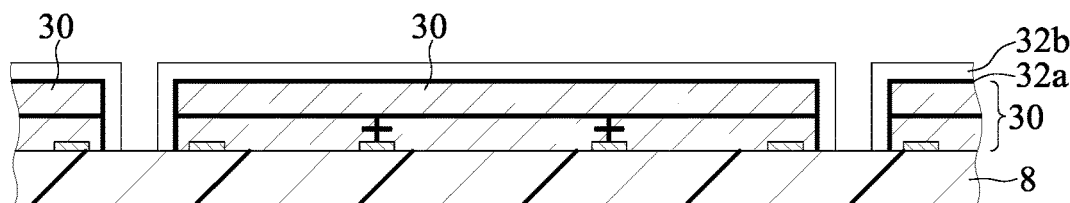

As shown in FIGS. 3A and 3B, a wafer 4 is singulated to obtain a plurality of electronic components 30. Then, the plurality of electronic components 30 are arranged at intervals on a panel form carrier 8.

In an embodiment, the electronic component 30 has a structure similar to that of the first electronic component 21. The electronic component 30 includes an active face 30a and a non-active face 30b opposite to each other; the active face 30a including a plurality of electrode pads 300 and a plurality of contacts 300a; a plurality of wires 301 electrically connected with the electrode pads 300 being provided inside the electronic component 30; and the active face 30a being attached onto the carrier 8. It can be understood that conductors 212 as shown in FIG. 2A can be formed on the electrode pads 300 and the contacts 300a depending on the needs, and the conductors 212 can be covered by an insulating protective film (not shown), and the electronic component 30 is attached onto the carrier 8 by the insulating protective film.

Moreover, after singulation of the wafer 4, the wire 301 is exposed from side faces 30c of the electronic component 30. It can be understood that the wire 301 can also be exposed from the non-active face 30b of the electronic component 30.

As shown in FIGS. 3C to 3E-1, a first metal layer 32a, an insulating layer 32b, and a second metal layer 32c are sequentially formed on the non-active face 30b and the side faces 30c of the electronic component 30, and the first metal layer 32a is free from being in contact with the second metal layer 32c, such that the first metal layer 32a, the insulating layer 32b, and the second metal layer 32c act as a capacitor structure 32 (such as a decap), and that the capacitor structure 32 covers the electronic component 30.

In an embodiment, the first metal layer 32a is coated on the entire or part of the non-active face 30b and/or the entire or part of the side faces 30c of the electronic component 30 by electroplating, deposition or other methods. The insulating layer 32b is coated on the entire surface of the first metal layer 32a, and the second metal layer 32c is coated on the entire surface of the insulating layer 32b by electroplating, deposition, or other methods.

Moreover, the first metal layer 32a is in contact with the wire 301, so as to electrically connect with the electrode pads 300 via the wire 301. The first metal layer 32a is free from being electrically connected with the contacts 300a. For example, the capacitor structure 32 corresponds to a single set of power supply transmission structure (i.e., the electrode pads 300) of the electronic component 30. As such, the first metal layer 32a is a single electrical connector, and the second metal layer 32c acts as a ground port of the capacitor structure 32.

Figures 1, 3E:
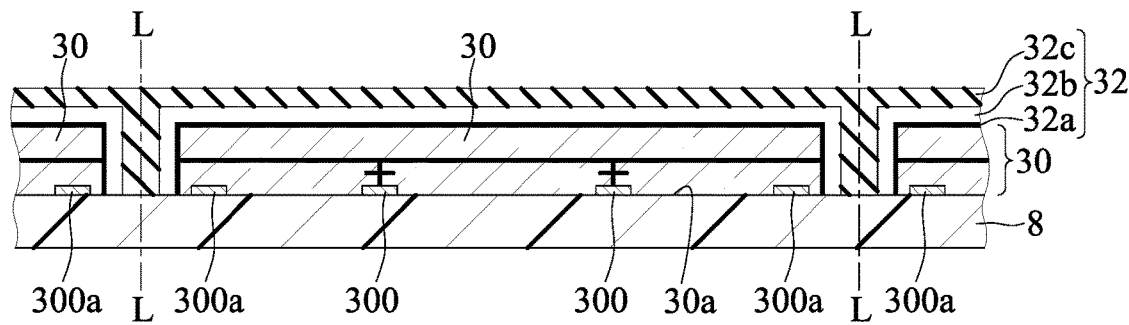
Figures 2, 3E:
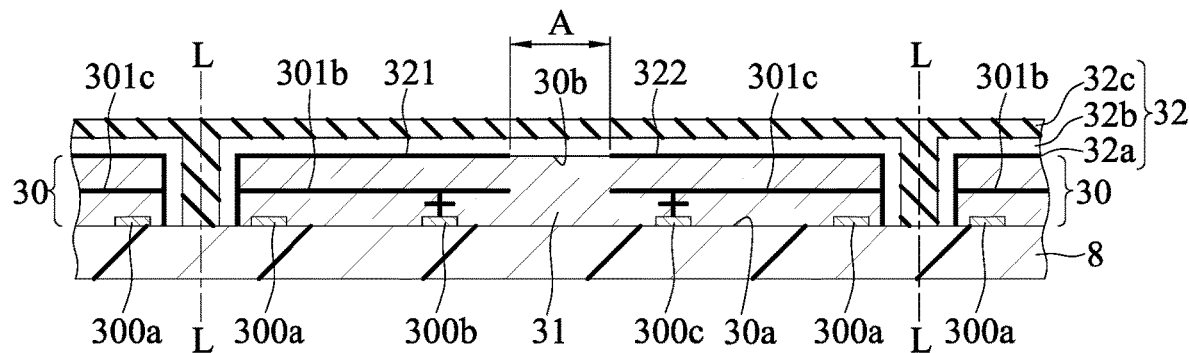
Figures 3, 3E:
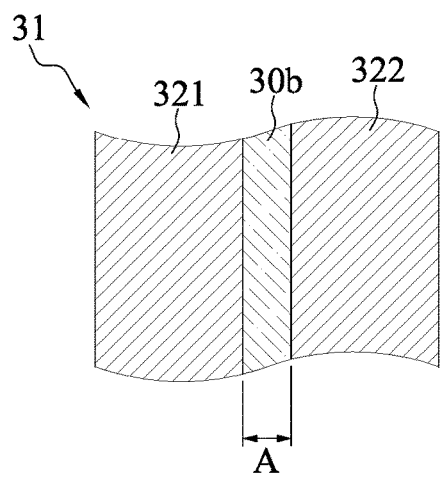

Alternatively, as shown in FIG. 3E-2, the capacitor structure 32 can also correspond to several sets of power supply transmission structures of the electronic component 31. For example, the electronic component 31 includes two sets of power supply transmission structures, and the first metal layer 32a includes a plurality of electrical connectors 321, 322 separate from and not connected with each other, as shown in FIG. 3E-3, such that the plurality of electrical connectors 321, 322 are electrically connected to different sets of power supply transmission structure (i.e., different wires 301b, 301c or different electrode pads 300b, 300c), respectively, and the second metal layer 32c acts as the ground port of the capacitor structure 32. Specifically, a partitioning region A is formed between the electrical connectors 321 and 322 on the non-active face 30b. The partitioning region A is free from being covered by the first metal layer 32a, and the insulating layer 32b is formed on the partitioning region A to be in contact with the non-active face 30b.

Figures 1, 3F:
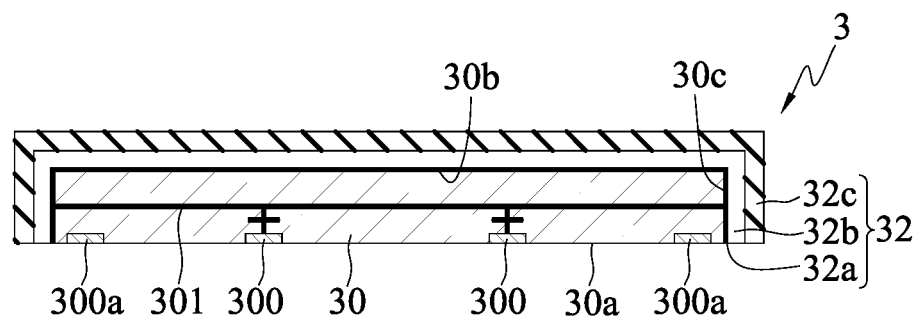
Figures 2, 3F:
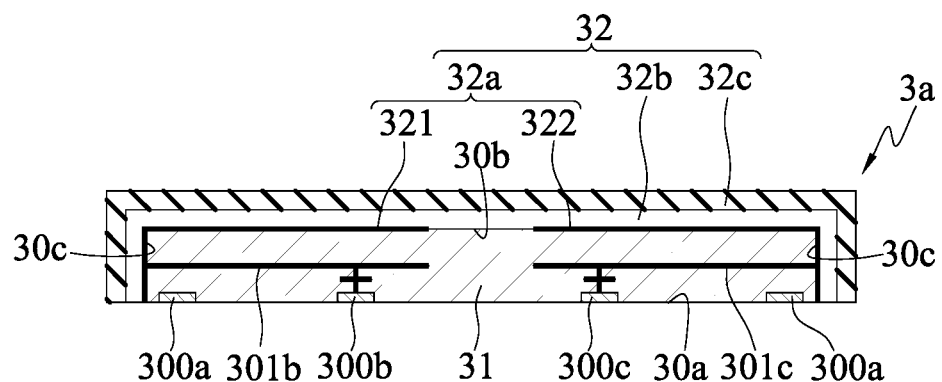

As shown in FIG. 3F-1, subsequent to the process shown in FIG. 3E-1, a singulation process is performed along cutting paths L shown in FIG. 3E-1, and then the carrier 8 is removed to obtain a plurality of electronic modules 3, and the capacitor structure 32 is free from being formed on the active face 30a of the electronic component 30, 31.

In an embodiment, the electronic module 3 is applied to the electronic package 2 shown in FIG. 2E. The electronic component 30 includes only one set of power supply transmission structure (i.e., the electrode pads 300), so the electronic component 30 can provide the power required by one second electronic component 24, other second electronic components 24 will need to connect to additional power supplies.

Furthermore, if continuing the process shown in FIG. 3E-2, an electronic module 3a can be obtained, as shown in FIG. 3F-2. The electronic module 3a can be applied to the electronic package 2 shown in FIG. 2E. The electronic component 31 includes two sets of power supply transmission structures (i.e., the electrode pads 300b, 300c), so the electronic component 31 is capable of providing the power needed by two second electronic components 24.

It can be understood that, based on the number of sets of the power supply transmission structures in the electronic component 30, 31, the number of electrical connectors 321, 322 of the first metal layer 32a can be modified as needed, and the present disclosure is not limited to the above.

As such, the electronic module 3, 3a of the present disclosure uses the MIM diode technique to form the capacitor structure 32 on the electronic component 30, 31, thereby simplifying the manufacturing process. Thus, compared to the silicon board drilling process of the prior art, the electronic module 3, 3a of the present disclosure has a simpler and shorter manufacturing process, a higher production yield, and a lower manufacturing cost, thus meeting the demand for lowering the cost of the electronic package 2 and the subsequent product applications.

The present disclosure provides an electronic module 3, 3a, which includes: an electronic component 30, 31 and a capacitor structure 32.

The electronic component 30, 31 includes an active face 30a and a non-active face 30b opposite to each other and side faces 30c adjacent to the active face 30a and the non-active face 30b. The active face 30a includes a plurality of electrode pads 300, 300b, 300c.

The capacitor structure 32 is formed on the electronic component 30, 31 and exposed from the active face 30a, wherein the capacitor structure 32 includes a first metal layer 32a disposed on the electronic component 30, 31 and electrically connected with the plurality of electrode pads 300, 300b, 300c, an insulating layer 32b disposed on the first metal layer 32a, and a second metal layer 32c disposed on the insulating layer 32b and electrically coupled with the first metal layer 32a, and the first metal layer 32a is free from being in contact with the second metal layer 32c.

In an embodiment, the capacitor structure 32 is formed on the non-active face 30b and/or the side faces 30c of the electronic component 30, 31.

In an embodiment, the capacitor structure 32 is of a decoupling capacitor type.

In an embodiment, at least one wire 301, 301b, 301c electrically connected with the electrode pads 300, 300b, 300c is provided inside the electronic component 30, 31, so that the first metal layer 32a is electrically connected with the wire 301, 301b, 301c. For example, the wire 301, 301b, 301c is exposed from the side faces 30c and/or the non-active face 30b of the electronic component 30, 31.

In an embodiment, the electronic component 30 includes a single set of power supply transmission structure (i.e., the interconnected electrode pads 300 and wire 301), and the capacitor structure 32 is electrically connected with the power supply transmission structure.

In an embodiment, the electronic component 31 includes multiple sets of power supply transmission structures (i.e., the interconnected electrode pads 300b and wire 301b, and the interconnected electrode pads 300c and wire 301c), and the capacitor structure 32 is electrically connected with the multiple sets of power supply transmission structures. For example, the first metal layer 32a includes a plurality of separated and not interconnected electrical connectors 321, 322, such that the plurality of electrical connectors 321, 322 are electrically connected to different sets of the power supply transmission structures, respectively. Moreover, a partitioning region A is formed between the electrical connectors 321, 322 on the non-active face 30b, and the partitioning region A is free from being covered by the first metal layer 32a, and the insulating layer 32b is formed on the partitioning region A and in contact with the non-active face 30b.

In an embodiment, the electronic module 3, 3a can be applied to an electronic package 2. The electronic module 3, 3a is disposed on a carrier structure 20 having a first circuit layer 201 in the electronic package 2, and the electronic module 3, 3a includes the electronic component 30, 31 (or the first electronic component 21) and the capacitor structure 22, 32, and the capacitor structure 22, 32 is electrically connected with the first circuit layer 201.

The electrode pads 300, 210 of the electronic component 30, 31 (or the first electronic component 21) of the electronic module 3, 3a are electrically connected to a routing structure 26.

In an embodiment, the routing structure 26 includes a first surface 26a and a second surface 26b opposite to each other, such that the electronic module 3, 3a is disposed on the first surface 26a, and at least one second electronic component 24 is disposed on the second surface 26b. Alternatively, the first circuit layer 201 of the carrier structure 20 and the routing structure 26 are electrically connected with each other via a plurality of conductive posts 23.

In an embodiment, a plurality of conductive posts 23 electrically connected with the first circuit layer 201 are formed on the carrier structure 20.

In an embodiment, the electronic package 2 further includes an encapsulant 25 for covering the plurality of conductive posts 23, the electronic component 30, 31 (or the first electronic component 21) and the capacitor structure 22, 32.

In summary, the electronic module, the manufacturing method thereof and the electronic package having the same of the present disclosure allows the capacitor structure to be located adjacent to the electronic component by directly forming a multi-layer composite capacitor structure on the electronic component. Thus, the electronic module of the present disclosure not only minimizes the distance between the decoupling capacitor and the semiconductor chip to optimize the effect of impedance suppression, but at the same time, meets the demand for lower manufacturing cost.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic module, comprising:
an electronic component having an active face and a non-active face opposite to the active face and side faces adjacent to the active face and the non-active face, and the active face including a plurality of electrode pads; and
a capacitor structure formed on the non-active face and/or the side faces of the electronic component and free from being formed on the active face, wherein the capacitor structure includes a first metal layer disposed on and in contact with the electronic component and electrically connected with the plurality of electrode pads, an insulating layer disposed on the first metal layer, and a second metal layer disposed on the insulating layer and coupled with the first metal layer, and wherein the first metal layer is free from being in contact with the second metal layer.

2. The electronic module of claim 1, wherein the capacitor structure is formed on at least one of the non-active face and the side faces of the electronic component.

3. The electronic module of claim 1, wherein the capacitor structure is of a decoupling capacitor type.

4. The electronic module of claim 1, further comprising at least one wire disposed inside the electronic component and electrically connected with the electrode pads, wherein the first metal layer is electrically connected with the wire.

5. The electronic module of claim 4, wherein the wire is exposed from at least one of the side faces and the non-active face of the electronic component.

6. The electronic module of claim 1, wherein the electronic component includes a single set of power supply transmission structure, and the capacitor structure is electrically connected with the power supply transmission structure.

7. The electronic module of claim 1, wherein the electronic component includes multiple sets of power supply transmission structures, and the capacitor structure is electrically connected with the multiple sets of power supply transmission structures.

8. The electronic module of claim 7, wherein the first metal layer includes a plurality of separate electrical connectors electrically connected to different sets of the power supply transmission structures, respectively.

9. The electronic module of claim 8, further comprising a partitioning region formed between the electrical connectors on the non-active face, wherein the partitioning region is free from being covered by the first metal layer, and the insulating layer is formed on the partitioning region and in contact with the non-active face.

10. An electronic package, comprising:

a carrier structure including a circuit layer; and the electronic module of claim 1 disposed on the carrier structure, wherein the capacitor structure is electrically connected with the circuit layer.

11. The electronic package of claim 10, further comprising a routing structure electrically connected with the electronic component.

12. The electronic package of claim 11, wherein the routing structure includes a first surface and a second surface opposite to the first surface, such that the electronic module is disposed on the first surface, and at least one second electronic component is disposed on the second surface.

13. The electronic package of claim 11, wherein the circuit layer of the carrier structure and the routing structure are electrically connected with each other via a plurality of conductive posts.

14. The electronic package of claim 10, further comprising a plurality of conductive posts formed on the carrier structure and electrically connected with the circuit layer.

15. The electronic package of claim 14, further comprising an encapsulant covering the plurality of conductive posts, the electronic component and the capacitor structure.

16. The electronic package of claim 10, further comprising an encapsulant covering the electronic component and the capacitor structure.

\* \* \* \* \*